US012568849B2

(12) United States Patent
Wang et al.

(10) Patent No.: US 12,568,849 B2
(45) Date of Patent: Mar. 3, 2026

(54) DAM FOR THREE-DIMENSIONAL INTEGRATED CIRCUIT

(71) Applicant: Taiwan Semiconductor Manufacturing Co., Ltd., Hsinchu (TW)

(72) Inventors: Tsung-Ding Wang, Tainan City (TW); An-Jhih Su, Taoyuan City (TW); Chien Ling Hwang, Hsinchu (TW); Jung Wei Cheng, Hsinchu (TW); Hsin-Yu Pan, Taipei (TW); Chen-Hua Yu, Hsinchu (TW)

(73) Assignee: TAIWAN SEMICONDUCTOR MANUFACTURING COMPANY, Hsin-Chu (TW)

( * ) Notice: Subject to any disclaimer, the term of this patent is extended or adjusted under 35 U.S.C. 154(b) by 350 days.

(21) Appl. No.: 17/121,232

(22) Filed: Dec. 14, 2020

(65) Prior Publication Data

US 2021/0098318 A1 Apr. 1, 2021

Related U.S. Application Data

(60) Continuation of application No. 16/019,083, filed on Jun. 26, 2018, now Pat. No. 10,867,878, which is a
(Continued)

(51) Int. Cl.
H01L 23/04 (2006.01)
H01L 21/56 (2006.01)
(Continued)

(52) U.S. Cl.
CPC ............ H01L 23/04 (2013.01); H01L 21/563 (2013.01); H01L 23/10 (2013.01);
(Continued)

(58) Field of Classification Search
CPC ........... H01L 2224/26175; H01L 23/42; H01L 25/0657; H01L 23/49816; H01L 24/05; H01L 24/16; H01L 24/32; H01L 2224/16227; H01L 2224/32225; H01L 2924/15311; H01L 24/81; H01L 23/04; H01L 21/563; H01L 23/10; H01L 23/3675; H01L 2224/04026
(Continued)

(56) References Cited

U.S. PATENT DOCUMENTS

| | | | |
|---|---|---|---|
| 5,120,678 A | 6/1992 | Moore et al. | |
| 6,291,264 B1 | 9/2001 | Tang et al. | |

(Continued)

FOREIGN PATENT DOCUMENTS

| | | | |
|---|---|---|---|
| CN | 100373615 C | * | 3/2008 |

*Primary Examiner* — David Chen
(74) *Attorney, Agent, or Firm* — Slater Matsil, LLP

(57) ABSTRACT

An apparatus comprising a first substrate, a dam structure disposed on a first side of the first substrate, and an integrated circuit (IC) memory chip coupled to the first side of the first substrate by a plurality of first conductive members. A second substrate is coupled to a second side of the first substrate by a plurality of second conductive members. A lid coupled to the second substrate encloses the IC memory chip and the first substrate. A thermal interface material (TIM) is coupled between the lid and the dam structure.

19 Claims, 5 Drawing Sheets

Related U.S. Application Data division of application No. 14/212,985, filed on Mar. 14, 2014, now Pat. No. 10,020,236.

(51) Int. Cl.

| | |
|---|---|
| *H01L 23/00* | (2006.01) |
| *H01L 23/10* | (2006.01) |
| *H01L 23/367* | (2006.01) |
| *H01L 23/42* | (2006.01) |
| *H01L 25/065* | (2023.01) |
| *H01L 23/498* | (2006.01) |

(52) U.S. Cl.

CPC .......... *H01L 23/3675* (2013.01); *H01L 23/42* (2013.01); *H01L 24/83* (2013.01); *H01L 25/0657* (2013.01); *H01L 23/49816* (2013.01); *H01L 24/02* (2013.01); *H01L 24/05* (2013.01); *H01L 24/11* (2013.01); *H01L 24/14* (2013.01); *H01L 24/16* (2013.01); *H01L 24/17* (2013.01); *H01L 24/27* (2013.01); *H01L 24/29* (2013.01); *H01L 24/32* (2013.01); *H01L 24/33* (2013.01); *H01L 24/81* (2013.01); *H01L 2224/023* (2013.01); *H01L 2224/04026* (2013.01); *H01L 2224/11616* (2013.01); *H01L 2224/14181* (2013.01); *H01L 2224/16145* (2013.01); *H01L 2224/16146* (2013.01); *H01L 2224/16227* (2013.01); *H01L 2224/17181* (2013.01); *H01L 2224/26145* (2013.01); *H01L 2224/26175* (2013.01); *H01L 2224/27013* (2013.01); *H01L 2224/2745* (2013.01); *H01L 2224/27452* (2013.01); *H01L 2224/27462* (2013.01); *H01L 2224/27602* (2013.01); *H01L 2224/27616* (2013.01); *H01L 2224/27622* (2013.01); *H01L 2224/29011* (2013.01); *H01L 2224/29124* (2013.01); *H01L 2224/29138* (2013.01); *H01L 2224/29147* (2013.01); *H01L 2224/29166* (2013.01); *H01L 2224/29181* (2013.01); *H01L 2224/29187* (2013.01); *H01L 2224/29191* (2013.01); *H01L 2224/2929* (2013.01); *H01L 2224/29294* (2013.01); *H01L 2224/29309* (2013.01); *H01L 2224/29387* (2013.01); *H01L 2224/32145* (2013.01); *H01L 2224/32225* (2013.01); *H01L 2224/32245* (2013.01); *H01L 2224/33181* (2013.01); *H01L 2224/33505* (2013.01); *H01L 2224/73204* (2013.01); *H01L 2224/73253* (2013.01); *H01L 2224/81191* (2013.01); *H01L 2224/81815* (2013.01); *H01L 2224/83007* (2013.01); *H01L 2224/83051* (2013.01); *H01L 2224/83104* (2013.01); *H01L 2224/83191* (2013.01); *H01L 2224/83192* (2013.01); *H01L 2224/83193* (2013.01); *H01L 2224/83203* (2013.01); *H01L 2224/83815* (2013.01); *H01L 2224/83855* (2013.01); *H01L 2224/83862* (2013.01); *H01L 2225/06513* (2013.01); *H01L 2225/06517* (2013.01); *H01L 2225/06541* (2013.01); *H01L 2225/06548* (2013.01); *H01L 2225/06589* (2013.01); *H01L 2924/1434* (2013.01); *H01L 2924/15153* (2013.01); *H01L 2924/15311* (2013.01); *H01L 2924/16152* (2013.01); *H01L 2924/163* (2013.01); *H01L 2924/3511* (2013.01)

(58) Field of Classification Search

USPC ........ 257/667, 675, 712, 737, 778, E21.503; 438/108, 121, 122

See application file for complete search history.

(56) References Cited

U.S. PATENT DOCUMENTS

| | | | |
|---|---|---|---|
| 8,928,104 B2 | 1/2015 | Tu et al. | |
| 2003/0030140 A1 | 2/2003 | Shim | |
| 2003/0030968 A1* | 2/2003 | Tsao ................. | H01L 23/49816 257/E23.101 |
| 2004/0012097 A1* | 1/2004 | Chang ................. | H05K 3/3452 257/E21.511 |
| 2004/0056341 A1* | 3/2004 | Endo ....................... | H01L 23/50 257/E23.079 |
| 2007/0081314 A1 | 4/2007 | Nakatani | |
| 2007/0145571 A1 | 6/2007 | Lee et al. | |
| 2007/0228532 A1 | 10/2007 | Echols et al. | |
| 2008/0185712 A1 | 8/2008 | Kanayama et al. | |
| 2009/0108429 A1 | 4/2009 | Tsao et al. | |
| 2009/0224384 A1 | 9/2009 | Hou et al. | |
| 2009/0283902 A1 | 11/2009 | Bezama et al. | |
| 2009/0294938 A1* | 12/2009 | Chen ....................... | H01L 24/96 257/676 |
| 2010/0044856 A1 | 2/2010 | Sri-Jayantha et al. | |
| 2010/0270680 A1 | 10/2010 | Chow et al. | |
| 2011/0042795 A1* | 2/2011 | Knickerbocker ........................... | H01L 23/49827 257/E21.585 |
| 2011/0074015 A1 | 3/2011 | Suzuki | |
| 2011/0147916 A1 | 6/2011 | Su | |
| 2011/0198760 A1 | 8/2011 | Shibuya | |
| 2011/0279717 A1* | 11/2011 | Wakiyama ........ | H01L 27/14605 257/459 |
| 2012/0007229 A1 | 1/2012 | Bartley et al. | |
| 2012/0018871 A1* | 1/2012 | Lee ....................... | H01L 23/562 257/E23.194 |
| 2012/0049355 A1 | 3/2012 | Hosokawa et al. | |
| 2012/0061852 A1 | 3/2012 | Su et al. | |
| 2012/0061858 A1 | 3/2012 | Park et al. | |
| 2012/0083073 A1 | 4/2012 | Tanuma et al. | |
| 2012/0119346 A1 | 5/2012 | Im et al. | |
| 2012/0182694 A1* | 7/2012 | Lin ........................ | H01L 23/16 361/728 |
| 2013/0016477 A1 | 1/2013 | Yokoya et al. | |
| 2013/0093075 A1* | 4/2013 | Liu ........................ | H01L 23/36 438/126 |
| 2013/0119527 A1 | 5/2013 | Luo et al. | |
| 2013/0119528 A1 | 5/2013 | Groothuis et al. | |
| 2013/0241039 A1 | 9/2013 | Choi et al. | |
| 2013/0307128 A1 | 11/2013 | Lin et al. | |
| 2014/0027920 A1 | 1/2014 | Kodama | |
| 2014/0048324 A1 | 2/2014 | Lin et al. | |
| 2014/0091461 A1* | 4/2014 | Shen ....................... | H01L 23/24 257/737 |
| 2014/0138852 A1 | 5/2014 | Suda | |
| 2014/0239467 A1* | 8/2014 | Aoshima ............... | H01L 23/562 257/666 |
| 2014/0367844 A1 | 12/2014 | Hopper et al. | |
| 2015/0035131 A1 | 2/2015 | Ko et al. | |
| 2015/0035134 A1 | 2/2015 | Hung et al. | |
| 2015/0179607 A1 | 6/2015 | Ho et al. | |

* cited by examiner

DAM FOR THREE-DIMENSIONAL INTEGRATED CIRCUIT

PRIORITY CLAIM AND CROSS-REFERENCE

This application is a continuation of U.S. patent application Ser. No. 16/019,083, filed on Jun. 26, 2018, entitled "Dam for Three-Dimensional Integrated Circuit", which is a divisional of U.S. patent application Ser. No. 14/212,985, filed on Mar. 14, 2014, which application is hereby incorporated herein by reference.

BACKGROUND

In the manufacture and design of semiconductors, flip chip technology provides a method for connecting and packaging integrated circuit (IC) chips. The manner in which IC chips are packaged dictates overall cost, performance, and reliability of the packaged chips, although sometimes in a detrimental manner.

For example, a thermal interface material (TIM) member may be applied to a substrate in preparation for the assembly of a heat sink and/or other type lid to the substrate after an underfill material has been injected between the substrate and an IC chip that has been flip chip mounted to the substrate. However, if the underfill material has spread into the region where the TIM member is to be applied, the TIM will not adequately adhere to the substrate, which can result in insufficient cooling of the IC chip and/or inadequate adhesion of the heat sink and/or other type of lid to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
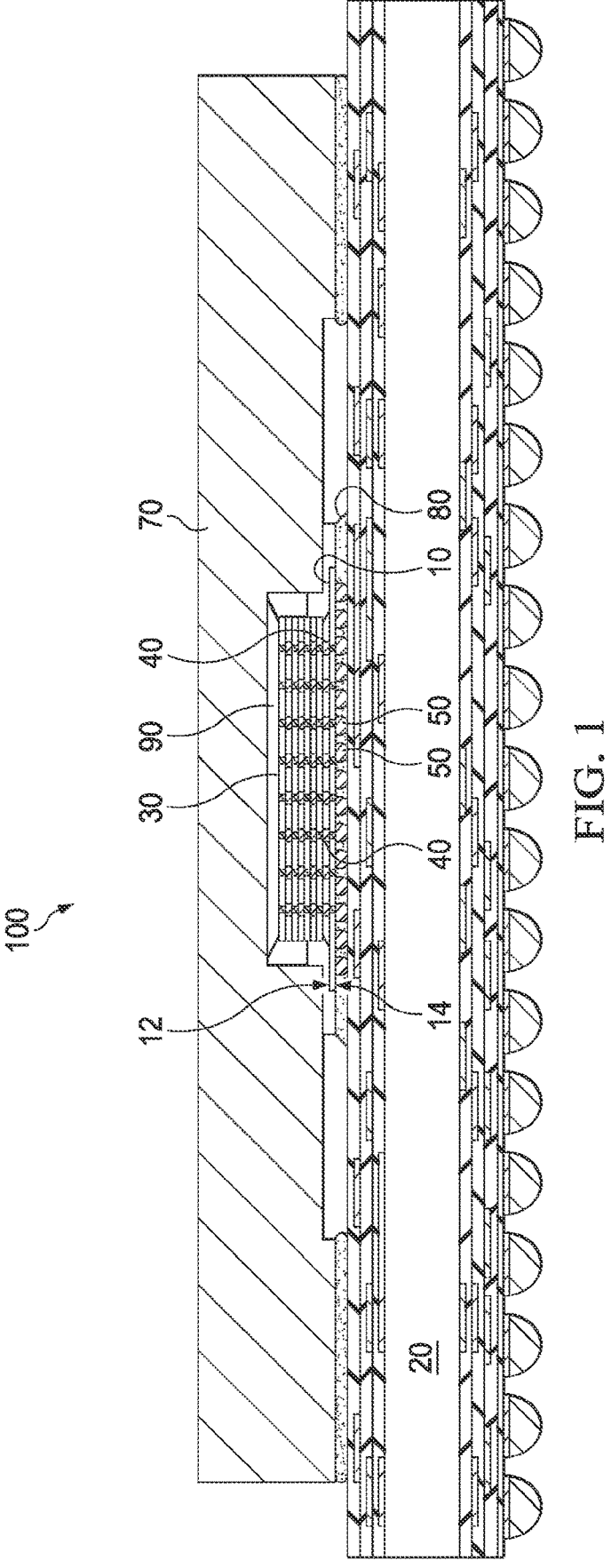
FIG. 1 is a schematic view of at least a portion of apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A common type of packaging for IC chips is the ball grid array (BGA) package, which uses multiple solder balls or bumps for electrical and mechanical interconnection of IC chips to other devices. Additionally, underfill (UF) materials may be used to further secure the chip in place and/or to insulate circuits and connectors. As advancing design of devices requires smaller features and higher precision, even small amounts of UF creeping into unwanted areas may cause undesired thermal and/or delamination impacts that negatively affect device function.

FIG. 1 is a schematic view of at least a portion of an apparatus 100 according to one or more aspects of the present disclosure. The apparatus 100 may be or comprise a microelectronics device comprising a first substrate 10 and a second substrate 20. One or both of the first and second substrates 10 and/or 20 may be or comprise a through-silicon-via (TSV) logic and/or other TSV die, an application processor (AP) die, and/or another microelectronic device die. In an example implementation, the first substrate 10 is or comprises a logic device, an AP die, or a TSV die, and the second substrate 20 is or comprises an organic substrate. An integrated circuit (IC) memory chip 30 is coupled to the first side 12 of the first substrate 10 by a plurality of first conductive members 40. The IC memory chip 30 may be or comprise one or more memory chips and/or modules, although other IC chips are also within the scope of the present disclosure. A plurality of second conductive members 50 couples the second substrate 20 to a second side 14 of the first substrate 10. The plurality of first conductive members 40 may comprise a first conductive bump (CBA) array and the plurality of second conductive members 50 may comprise a second CBA. The first and second CBAs may each be or comprise a ball grid array (BGA). The IC memory chip 30 may comprise one or more hybrid memory cube devices, other types of stacked memory chips, and/or other three-dimensional (3D) IC components, although other embodiments are also within the scope of the present disclosure.

Figures 2, 3:
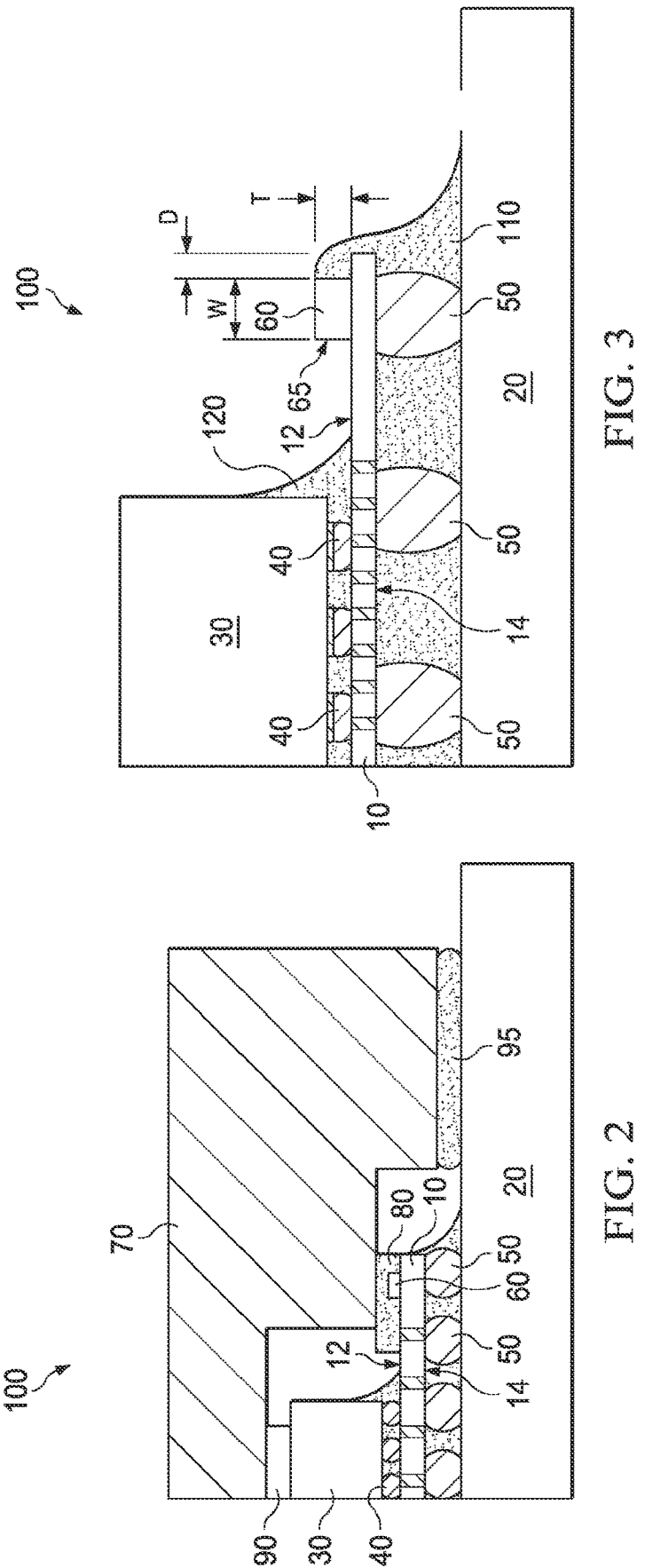
FIG. 2 is a sectional view of a portion of the apparatus shown in FIG. 1 in accordance with some embodiments.
FIG. 3 is a sectional view of a portion of the apparatus shown in FIG. 2 in accordance with some embodiments.

FIG. 2 is a sectional view of a portion of the apparatus 100 shown in FIG. 1. Referring to FIGS. 1 and 2, collectively, a dam structure 60 formed on the first side 12 of the first substrate 10 extends around the IC memory chip 30 and the plurality of first conductive members 40. A lid 70 may be coupled to the second substrate 20 and enclose the IC memory chip 30 and the first substrate 10. The lid 70 may also be coupled to the first substrate 10 and/or the IC memory chip 30. The apparatus 100 may further comprise a first thermal interface material (TIM) member 80 disposed between the lid 70 and the dam structure 60, and a second TIM member 90 disposed between the lid 70 and the IC memory chip 30.

FIG. 3 is an enlarged view of a portion of the apparatus 100 shown in FIGS. 1 and 2. However, the portion of the apparatus 100 shown in FIG. 3 is depicted in an earlier stage of manufacture relative to that shown in FIG. 2. That is, the lid 70 and the TIM members 80 and 90 have not yet been formed and/or assembled in FIG. 3.

Referring to FIGS. 1-3, collectively, the apparatus 100 further comprises a first underfill material 110 and perhaps a second underfill material 120. The first underfill material 110 is disposed between the first substrate 10 and the second substrate 20, substantially filling gaps defined between the first substrate 10, the second substrate 10, and elements of the plurality of second conductive members 50. The second underfill material 120 is disposed between the first substrate 10 and the IC memory chip 30, substantially filling gaps defined between the first substrate 10, the IC memory chip 30, and elements of the plurality of first conductive members 40.

The first underfill material 110 and the second underfill material 120 may have substantially the same composition, or may be of different compositions. Moreover, embodiments within the scope of the present disclosure include those in which the first underfill material 110 and the second underfill material 120 are formed at separate times, in either order, as well as those in which the first underfill material 110 and the second underfill material 120 are formed substantially simultaneously, whether of the same or different composition.

The first underfill material 110 and/or the second underfill material 120 may be or comprise various types of underfill polymers, such as may comprise epoxy, silicone, phosphine oxide, polyethylene/polypropylene copolymers, and/or urethane polymers, including resin transfer molding (low pressure) and injection transfer molding (high pressure), among other examples. The first underfill material 110 and/or the second underfill material 120 may be formed by injection, perhaps while under vacuum. One or more setting, hardening, curing, and/or trimming processes may also be utilized.

The first underfill material 110 may also span the thickness of the first substrate 10, and may contact a radially outer surface 65 of the dam structure 60. However, the dam structure 60 prevents the first underfill material 110 from spreading further inward towards the IC memory chip 30, and may thus aid in ensuring that a portion of the surface on the first side 12 of the first substrate 10 will be free of underfill material and/or otherwise available to receive and adequately adhere to the first TIM member 80 and/or the lid 70. Thus, the apparatus 100 may be sealed by adequate adhesion between the lid 70, the first TIM member 80, the second TIM member 90, and a third TIM or adhesive member 95 between the lid 70 and the second substrate 20. At least one of the dam structure 60 and the first TIM member 80 may also isolate the first underfill material 110 from the second underfill material 120. One or more of the first and second TIM members 80 and 90 and/or the TIM or adhesive member 95 may also be or comprise an adhesive other than or in addition to a TIM member.

The dam structure 60 may be or comprise one or more members each having a width W and a thickness T. The width W may range between about five microns and about forty microns, such as in implementations in which the width W is about twenty microns, although other dimensions are also within the scope of the present disclosure. The thickness T may range between about four microns and about twenty microns, such as in implementations in which the thickness T is about twelve microns, although other dimensions are also within the scope of the present disclosure. The one or more members making up the dam structure 60 may individually or collectively extend around a substantial portion of the plurality of first conductive members 40, with sufficient separation from the second underfill material 120 and/or the IC memory chip 30 so as to permit successful inclusion of the TIM member 80 and/or the lid 70. All or a portion of the dam structure 60 may be laterally offset from the outer perimeter of the first substrate 10 by at least a distance D, which may range between about four microns and about twenty microns, such as in implementations in which the distance D is about twelve microns, although other dimensions are also within the scope of the present disclosure. However, it is believed that some degree of separation between the outer surface 65 of the dam structure 60 and the outer perimeter of the first substrate 10 improves the ability of the dam structure 60 to prevent the first underfill material 110 from spilling over the dam structure 60.

The dam structure 60 may be conductive or insulative, and may be electrically isolated from all other components of the apparatus 100. Thus, for example, the dam structure 60 may be a "dummy" structure serving only to prevent the passage of the first underfill material 110. In other implementations, however, the dam structure 60 may form a portion of the structure coupling the lid 70 to the first substrate 10, perhaps instead of or in conjunction with the TIM member 80.

The dam structure 60 may comprise one or more layers of conductive and/or dielectric materials, such as copper, aluminum, doped polysilicon, titanium, titanium nitride, tantalum nitride, titanium, silicon nitride, silicon oxide, combinations and/or alloys thereof, and/or other materials, and may be formed utilizing chemical-vapor deposition (CVD), plasma-enhanced CVD (PECVD), metal organic CVD (MOCVD), sputtering, epitaxial growth, and/or other processes. Forming the dam structure 60 may include depositing a seed layer and then electroplating copper and/or other materials onto the seed layer. Grinding, chemical mechanical planarizing (CMP), photolithography, and/or other processes may also be utilized to form the dam structure 60.

As described above, the apparatus 100 includes the TIM member 80 between the first substrate 10 and the lid 70, the TIM member 90 between the IC memory chip 30 and the lid 70, and the TIM member 95 between the second substrate 20 and the lid 70. The TIM members 80, 90, and 95 may facilitate the thermal coupling between the lid 70 and one or more of the first substrate 10, the second substrate 20, and the IC memory chip 30, such as by decreasing thermal resistance across such couplings and/or otherwise expediting heat dissipation. The TIM members 80, 90, and 95 may be or comprise a silicon-oil-based thermal grease, an aluminum nitride filled thermal grease, and/or a paste comprising indium and/or other materials, although other materials are also within the scope of the present disclosure. The TIM members 80, 90, and 95 may also reduce mechanical stress resulting from warping caused by, for example, different coefficients of thermal expansion of the first substrate 10, the second substrate 20, the IC memory chip 30, and/or the lid 70.

Figures 4, 5:
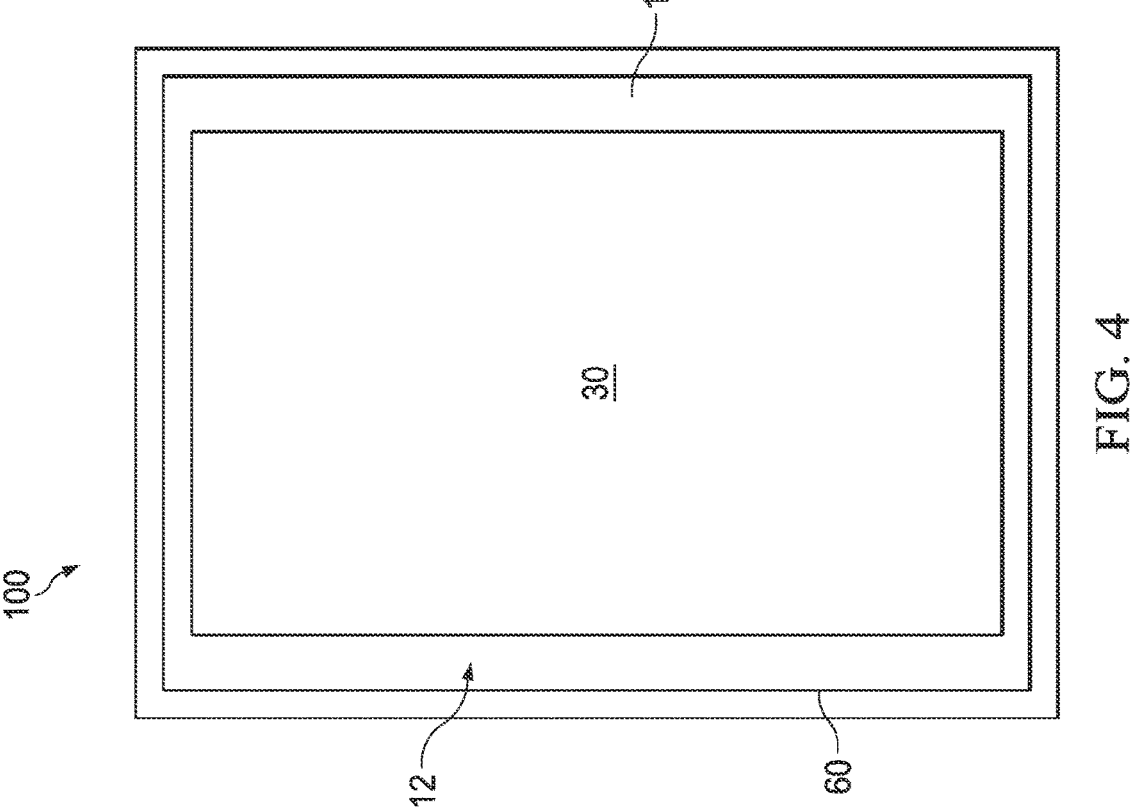
FIG. 4 is a plan view of at least a portion of apparatus in accordance with some embodiments.
FIG. 5 is a plan view of at least a portion of apparatus in accordance with some embodiments.

FIG. 4 is a plan view of the apparatus 100 shown in FIGS. 1-3, illustrating that the dam structure 60 may comprise a continuous barrier extending around the IC memory chip 30 and the plurality of first conductive members 40 (which are obstructed from view in FIG. 4). However, the dam structure 60 may have other shapes and/or forms within the scope of the present disclosure. For example, FIG. 5 is a plan view of another implementation of the apparatus 100 shown in FIGS. 1-4 in which the dam structure 60 comprises a slotted barrier, extending intermittently around the IC memory chip 30 instead of continuously. Moreover, the dam structure 60 may comprise a plurality of such barriers, whether continuous or intermittent, which may be disposed concentrically relative to each other and/or the IC memory chip 30. In implementations in which the dam structure 60 comprises multiple slotted or intermittent barriers 61, 62, and 63, the gaps between segments of such barriers may be radially misaligned. For example, underfill material flowing in a first direction extending through a gap 67 in the outer barrier 61 must travel in a second direction to reach a gap 68 in the next barrier 62, and the first and second directions may be substantially orthogonal.

Figures 6, 7:
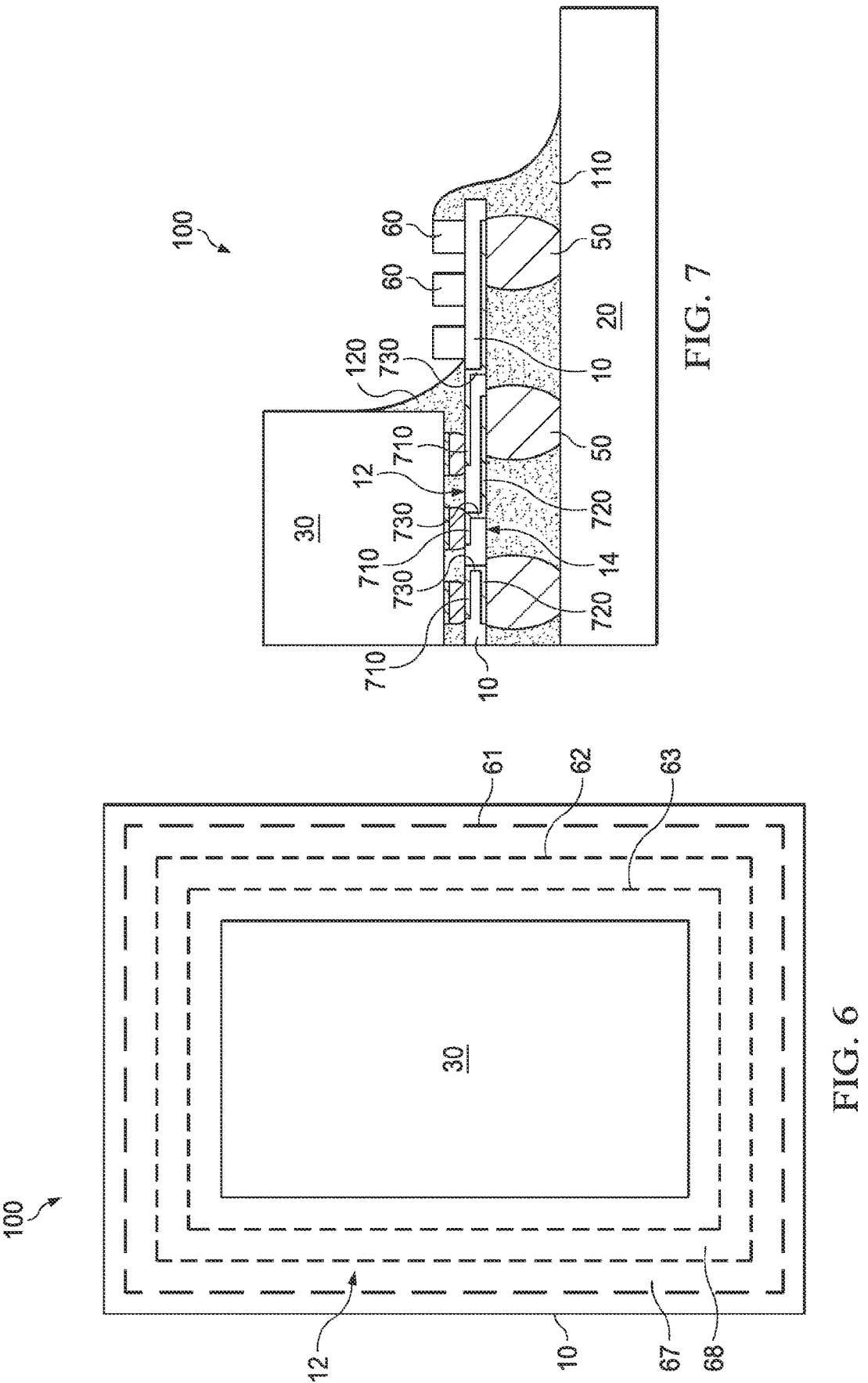
FIG. 6 is a plan view of at least a portion of apparatus in accordance with some embodiments.
FIG. 7 is a sectional view of a portion of the apparatus shown in FIG. 6 in accordance with some embodiments.

FIG. 7 is a sectional view of an implementation of the apparatus 100 shown in FIG. 3 in which conductive members 710 are formed in and/or on the surface of the first side 12 of the first substrate 10. The conductive members 710 may comprise traces, portions of a redistribution layer, interconnects, and/or other conductive features. At least a portion of the dam structure 60 may be formed simultaneously with the formation of one or more of the conductive members 710, whether by one or more of the manufacturing processes described above and/or otherwise. At least a portion of the plurality of first conductive members 40 may also or alternatively be formed simultaneously with the formation of one or more of the conductive members 710, whether by one or more of the manufacturing processes described above and/or otherwise. Thus, the plurality of first conductive members 40 may be formed on the first substrate 10 and then coupled to the IC memory chip 30, instead of being formed on the IC memory chip 30 and then coupled to the first substrate 10.

As also depicted in FIG. 7, the apparatus 100 may also comprise conductive members 720 in and/or on the surface of the second side 14 of the first substrate 10. The conductive members 720 may comprise traces, portions of a redistribution layer, interconnects, and/or other conductive features. At least a portion of the plurality of second conductive members 50 may be formed simultaneously with the formation of one or more of the conductive members 720, whether by one or more of the manufacturing processes described above and/or otherwise.

The apparatus 100 may further comprise conductive members 730 independently or cooperatively interconnecting one or more of the conductive members 710 with one or more of the conductive members 720. The conductive members 730 may comprise one or more through-silicon vias and/or other conductive features extending through the first substrate 10.

Figure 8:
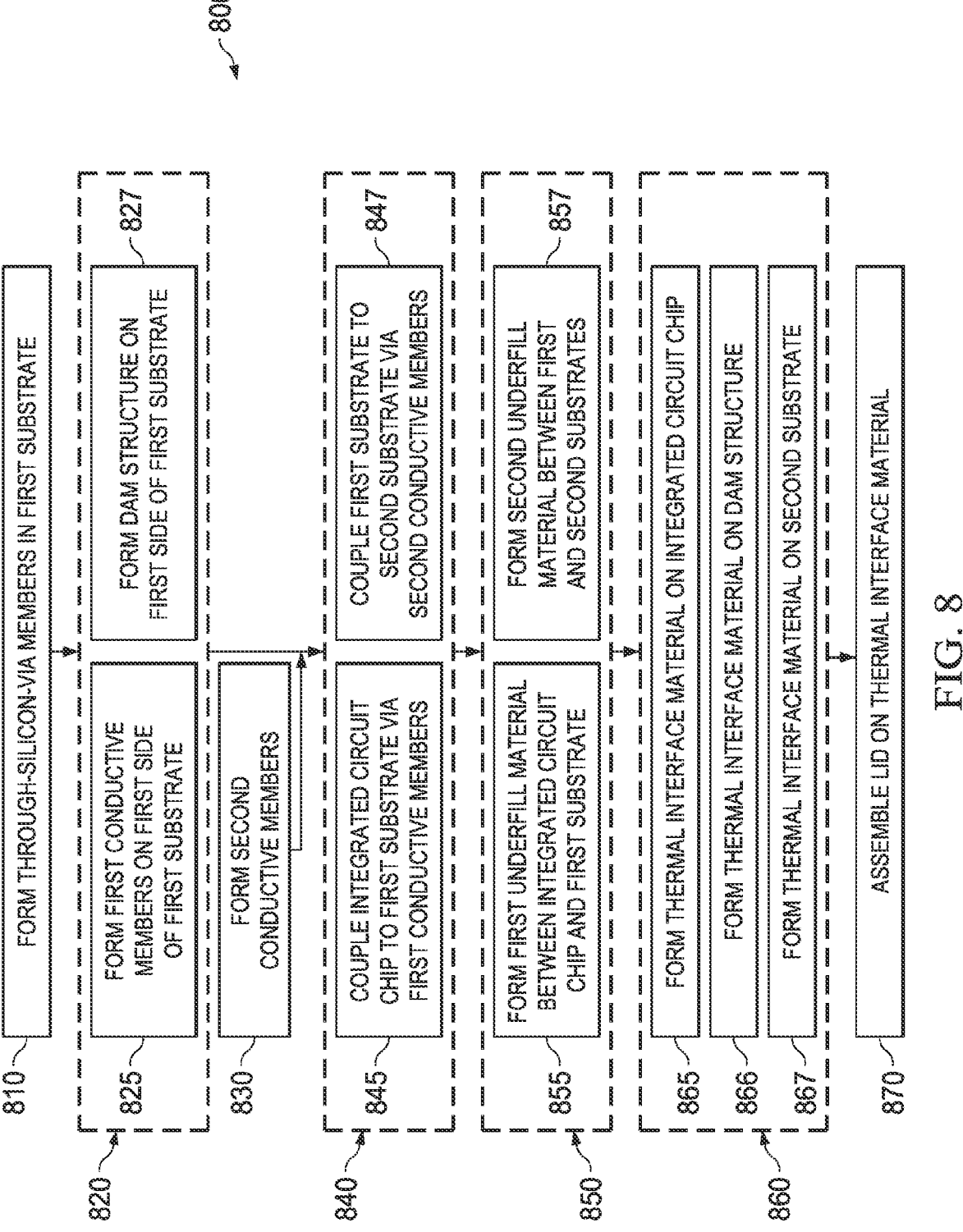
FIG. 8 is a flow-chart diagram of at least a portion of a method in accordance with some embodiments.

FIG. 8 is a flow-chart diagram of at least a portion of a method 800 according to one or more aspects of the present disclosure. The method 800 may be utilized to form at least a portion of one or more implementations of the apparatus shown in FIGS. 1-7 and/or otherwise within the scope of the present disclosure.

The method 800 may comprise forming 810 a plurality of through-silicon-vias and/or other conductive members extending through a first substrate. The method 800 further comprises a formation process 820 that includes forming 825 first conductive members on a first side of the first substrate and forming 827 a dam structure on the first side of the first substrate. The first conductive members and the dam structure may be formed in any order as part of the formation process 820, or they may be formed at least partially simultaneously in that they may share common deposition, patterning, CMP, and/or other processing. The method 800 also comprises forming 830 a plurality of second conductive members 840 on a second side of the first substrate and/or on a second substrate. The plurality of through-silicon-vias and/or other conductive members extending through the first substrate may each extend between ones of the plurality of first conductive members and corresponding ones of the plurality of second conductive members.

The method 800 also comprises an assembly process 840 that includes coupling 845 an IC memory chip to the first substrate via the plurality of first conductive members and coupling 847 the first substrate to the second substrate via the plurality of second conductive members. Such assembly may comprise one or more reflowing, hardening, curing, heating, soldering, pick-and-place, and/or other processes.

The method 800 may further comprise an underfill process 850 that includes forming 855 a first underfill material between the first and second substrates around elements of the plurality of second conductive members and forming 857 a second underfill material between the first substrate and the IC memory chip. Such underfill formation may be performed in any order, and perhaps substantially simultaneously.

The method 800 may further comprise a TIM process 860 that includes forming 865 a TIM member on the IC memory chip, forming 866 a TIM member on the dam structure, and forming 867 a TIM member on the second substrate. Such TIM member formation may be performed in any order, and perhaps substantially simultaneously, including by one or more of the processes described above.

The method 800 may further comprise assembling 870 a lid to one or more of the TIM members that may have been formed during the TIM process 860. The lid may comprise ceramic, plastic, metallic, and/or other materials. Assembling 870 the lid may entail applying an adhesive to mating surfaces of the lid and/or components opposite one or more corresponding TIM members, and then positioning the lid relative to the TIM member(s). Positioning the lid may entail utilization of an automated pick-and-place apparatus. Assembling 870 the lid may further entail hardening the adhesive in the presence and/or absence of a compressive force and/or other mechanical pressure, whether by applying heat and/or by other means. Assembling 870 the lid may further entail reflowing the TIM member(s) in the presence and/or absence of a compressive force and/or other mechanical pressure, whether by applying heat and/or by other means. Assembling 870 the lid may further entail curing the adhesive in the presence and/or absence of a compressive force and/or other mechanical pressure, whether by applying heat and/or by other means.

In view of all of the above, as well as the example implementations depicted in FIGS. 1-8, a person having ordinary skill in the art will readily recognize that the present disclosure introduces an apparatus comprising a first substrate, a dam structure disposed on a first side of the first substrate, and an integrated circuit (IC) chip coupled to the first side of the first substrate by a plurality of first conductive members. A second substrate is coupled to a second side of the first substrate by a plurality of second conductive members. A lid coupled to the second substrate encloses the IC memory chip and the first substrate. A thermal interface material (TIM) may be coupled between the lid and the dam structure.

In some implementations, the TIM may be a first TIM, and the apparatus may also include a second TIM coupled between the lid and the IC memory chip.

Such apparatus may also include an underfill material disposed between the second side of the first substrate and the second substrate, including within gaps defined between elements of the plurality of second conductive members. The underfill material may span the first substrate, perhaps contacting a radially outer surface of the dam structure. In some implementations, the underfill material may be a first underfill material, and the apparatus may also include a second underfill material disposed between the first side of the first substrate and the IC memory chip. At least one of the dam structure and the TIM may isolate the first and second underfill materials.

The plurality of first conductive members may be or include a first conductive bump array (CBA), and the plurality of second conductive members may be or include a second CBA.

At least one of the pluralities of first and second conductive members may include at least one portion of at least one redistribution layer.

The apparatus may also include a plurality of third conductive members each extending through the first substrate between corresponding ones of the first and second conductive members. The third conductive members may include one or more through-silicon-vias.

The present disclosure also introduces a method comprising forming first conductive members on a first side of a first substrate, forming a dam structure on the first side of the first substrate, and coupling an integrated circuit (IC) chip to the first substrate with the first conductive members. The first substrate is coupled to a second substrate with second conductive members.

The first conductive members may include a first conductive bump array (CBA) and the second conductive members may include a second CBA.

At least one of the first and second conductive members may include at least a portion of a redistribution layer.

The first substrate may include third conductive members each extending through the first substrate between corresponding ones of the first and second conductive members. In such implementations, the method may also include forming the third conductive members. The third conductive members may include one or more through-silicon-vias.

In some implementations, the IC memory chip is or includes a stacked memory chip. For example, the IC memory chip may be or include a hybrid memory cube.

In some implementations, forming the plurality of first conductive members and forming the dam structure occur substantially simultaneously.

The method may also include forming an underfill material between the first and second substrates around elements of the plurality of second conductive members. The underfill material may contact the dam structure. In some embodiments, the underfill material is a first underfill material and the method also includes forming a second underfill material between the first substrate and the IC memory chip, including around elements of the plurality of first conductive members.

The method may also include forming the second conductive members on a second side of the first substrate prior to coupling the first substrate to the second substrate.

In some implementations, the method includes forming the second conductive members on the second substrate prior to coupling the first substrate to the second substrate.

Embodiments within the scope of the present disclosure include those in which the dam structure extends continuously around a collective lateral perimeter of the plurality of first conductive members. However, the dam structure may also or alternatively extend intermittently around a collective lateral perimeter of the plurality of first conductive members. In some implementations, the dam structure includes multiple concentric portions each extending continuously and/or intermittently around a collective lateral perimeter of the plurality of first conductive members. In embodiments in which the dam structure includes multiple intermittent members that are concentric, gaps in the concentric portions of the dam structure may be radially misaligned.

The dam structure may comprise a member having a width and a height, wherein the member extends around a substantial portion of the plurality of first conductive members. In some embodiments, the width may be about 20 microns and the height may be about 12 microns. In some implementations, the width ranges between about 10 microns and about 40 microns, and the height ranges between about 8 microns and about 20 microns. The dam structure may comprise copper, among other possible materials.

The present disclosure also introduces an apparatus that includes a first substrate, a dam structure disposed on a first side of the first substrate, and a plurality of first conductive members disposed on the first side of the first substrate within the dam structure. The apparatus further comprises a second substrate, a plurality of second conductive members each mechanically and electrically connecting the second substrate to a second side of the first substrate, and an underfill material substantially filling gaps defined between the first and second substrates, including around elements of the plurality of second conductive members.

In some embodiments of such an apparatus, at least one of the pluralities of first and second conductive members comprises at least one portion of at least one redistribution layer. The first substrate may also include a plurality of third conductive members each extending through the first substrate between corresponding ones of the pluralities of first and second conductive members. The third conductive members may include one or more through-silicon-vias.

Some implementations of such an apparatus may further comprise an integrated circuit (IC) chip coupled to the first substrate via the plurality of first conductive members. The IC memory chip may include a stacked memory chip, such as a hybrid memory cube.

The underfill material may be a first underfill material, and the apparatus may also include a second underfill material between the first substrate and the IC memory chip, including around elements of the plurality of first conductive members.

The dam structure may isolate the IC memory chip from the underfill material. In some embodiments, the dam structure extends continuously around the plurality of first conductive members, collectively. The dam structure may also or alternatively extend intermittently around the plurality of first conductive members, collectively. The dam structure may include concentric portions each extending continuously or intermittently around the plurality of first conductive members, collectively. Gaps in concentric, intermittent portions of the dam structure may be radially misaligned.

In some implementations, the dam structure comprises at least one of: a continuous barrier extending around the plurality of first conductive members, collectively; a slotted barrier extending around the plurality of first conductive members, collectively; and a plurality of continuous and/or slotted barriers extending concentrically around the plurality of first conductive members, collectively.

Apparatus and/or methods in accordance with one or more aspects of the present disclosure may be utilized to avoid deleterious effects of underfill overflow. Thus, for example, apparatus constructed according to one or more aspects of the present disclosure may exhibit greater thermal dissipation than previously achieved. Moreover, potentially beneficial aspects of the present disclosure may be achieved without additional processing steps, such as in implementations in which a dam structure is formed on and/or in a substrate at the same time as other features of similar composition. In addition, one or more aspects of the present disclosure may permit the utilization of lower cost TIM materials, perhaps in response to increased assurance of adequate adhesion of the TIM members in the absence of underfill overflow.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first chip bonded to a first side of a first substrate by a first plurality of conductive connectors;
a dam structure on the first side of the first substrate, the dam structure being spaced apart from the first plurality of conductive connectors, the dam structure being a single, continuous structure around the first chip, the dam structure having a first sidewall, a second sidewall, and a top surface extending from the first sidewall to the second sidewall;
a second substrate bonded to a second side of the first substrate, the second side being opposite the first side;
a first underfill between the first and second substrates;
a second underfill between the first chip and the first substrate, the second underfill between and surrounding the first plurality of conductive connectors; and
a lid attached to the second substrate, the dam structure, and the first chip, the lid being attached to the first chip by a first thermal interface material (TIM) and to the dam structure by a second TIM, the lid having a first bottom surface, a first inner surface, a second bottom surface, a second inner surface, and a third bottom surface, each of the first, second, and third bottom surfaces being a different distance from the second substrate, the first bottom surface contacting the first TIM, the second bottom surface contacting the second TIM, and the third bottom surface contacting an adhesive member on the second substrate, the first inner surface extending from the first bottom surface to the second bottom surface, the second inner surface extending from the second bottom surface to the third bottom surface, the first and second inner surfaces being perpendicular to the first bottom surface, the second TIM physically contacting the first sidewall, the top surface, and the second sidewall of the dam structure and the first side of the first substrate, an air gap being between the second TIM and the first TIM;
wherein:
the dam structure is a different material than the first substrate,
the second TIM extends from the lid to the dam structure,
the first TIM extends from the lid to the first chip, and
the second TIM has a sidewall coterminous with a sidewall of the first substrate.

2. The structure of claim 1 further comprising:
a second plurality of conductive connectors bonding the first substrate to the second substrate, wherein the first underfill surrounds the second plurality of conductive connectors.

3. The structure of claim 2 further comprising:
a plurality of through substrate vias (TSVs) extending through the first substrate, each of the plurality of TSVs being coupled to corresponding ones of the pluralities of first and second conductive connectors.

4. The structure of claim 2, wherein the dam structure has a same material composition as the first plurality of conductive connectors.

5. The structure of claim 1, wherein the second TIM is spaced apart from the second underfill.

6. The structure of claim 1, wherein the lid is a continuous material from the adhesive member on the second substrate to the first TIM on the first chip and to the second TIM on the dam structure.

7. The structure of claim 1, wherein the dam structure is a dummy structure that is electrically isolated from the first chip, the first substrate, and the second substrate.

8. A structure comprising:
a dam structure disposed on a first side of a first substrate, each structure of the dam structure having a first thickness, an outermost sidewall of the dam structure being spaced apart from a sidewall of the first substrate by a first distance, the first distance being a same value as the first thickness;
an integrated circuit (IC) chip coupled to the first side of the first substrate by a plurality of first conductive members, the dam structure being spaced apart from the IC chip;
a second substrate coupled to a second side of the first substrate by a plurality of second conductive members; and
a lid coupled to the second substrate by an adhesive member, the lid further coupled to the dam structure by a first thermal interface material (TIM) and the IC chip by a second TIM, the first TIM extending along and physically contacting two sidewalls of the dam structure and having a sidewall coterminous with the sidewall of the first substrate, the first TIM physically contacting the first side of the first substrate, the first TIM being spaced apart from the IC chip and the second TIM, the lid being a continuous material from the adhesive member on the second substrate to the first and second TIMs on the dam structure and the IC chip, a first air gap separating the sidewall of the first substrate from a first sidewall of the lid, a second air gap separating a sidewall of the IC chip from a second sidewall of the lid.

9. The structure of claim 8 further comprising:

a first underfill material between the IC chip and the first side of the first substrate, the dam structure being spaced apart from the first underfill material.

10. The structure of claim 9 further comprising:

a second underfill material between the first and second substrates.

11. The structure of claim 8, wherein the dam structure extends continuously around the IC chip.

12. The structure of claim 8, wherein the dam structure comprises multiple concentric structures that each extend continuously around the IC chip.

13. The structure of claim 8, wherein the lid has a first bottom surface, a second bottom surface, and a third bottom surface, each of the first, second, and third bottom surfaces being a different distance from the second substrate, the first bottom surface contacting the second TIM on the IC chip, the second bottom surface contacting the first TIM on the dam structure, and the third bottom surface contacting the adhesive member on the second substrate.

14. The structure of claim 8, wherein the first thickness and the first distance are in a range from four microns to twenty microns.

15. A structure comprising:

a first chip bonded to a first side of a first substrate with a first plurality of conductive members;

a first underfill between the first chip and the first side of the first substrate and surrounding each of the first plurality of conductive members;

a dam structure on the first side of the first substrate, the dam structure comprising multiple members on the first side of the first substrate, each of the multiple members continuously surrounding the first plurality of conductive members, and each of the multiple members being laterally outside of outer sidewalls of the first chip, each member of the dam structure having a first thickness, an outermost sidewall of the dam structure being spaced apart from a sidewall of the first substrate by a first distance, the first distance being a same value as the first thickness;

a second substrate bonded to a second side of the first substrate with a second plurality of conductive members, the second side being opposite the first side;

a second underfill between the first and second substrates, the second underfill contacting the sidewall of the first substrate; and a lid attached to the second substrate, the dam structure, and the first chip, the lid being attached to the first chip by a first thermal interface material (TIM) and the dam structure by a second TIM, the second TIM being spaced apart from the first TIM, the lid having a first bottom surface, a second bottom surface, and a third bottom surface, each of the first, second, and third bottom surfaces being a different distance from the second substrate, the first bottom surface contacting the first TIM directly over the first chip, the second bottom surface contacting the second TIM directly over the dam structure, and the third bottom surface contacting an adhesive member on the second substrate.

16. The structure of claim 15, wherein the first underfill contacts a first member of the multiple members of the dam structure.

17. The structure of claim 15 further comprising:

a plurality of through substrate vias (TSVs) extending through the first substrate, each of the plurality of TSVs being coupled to corresponding ones of the pluralities of first and second conductive members.

18. The structure of claim 15, wherein the second TIM has a sidewall coterminous with the sidewall of the first substrate.

19. The structure of claim 15, wherein the second TIM contacts a top surface and a sidewall of one of the multiple members of the dam structure.

* * * * *